United States Patent [19]

Beeken et al.

[11] Patent Number: 4,760,486
[45] Date of Patent: Jul. 26, 1988

[54] PROTECTION DEVICE AGAINST FLASHOVER IN A TRANSMITTER CIRCUIT

[75] Inventors: Horst Beeken; Hans-Heinrich Vitters, both of Berlin, Fed. Rep. of Germany

[73] Assignee: Licentia Patent-Verwaltungs-GmbH, Frankfurt am Main, Fed. Rep. of Germany

[21] Appl. No.: 901,373

[22] Filed: Aug. 28, 1986

[30] Foreign Application Priority Data

Aug. 28, 1985 [DE] Fed. Rep. of Germany ....... 3530677

[51] Int. Cl.⁴ .............................................. H02H 9/04
[52] U.S. Cl. ...................................... 361/56; 361/130; 361/117
[58] Field of Search ......................... 361/111, 117–119, 361/128–130, 13, 91, 57, 54, 56

[56] References Cited

U.S. PATENT DOCUMENTS

| Re. 30,490 | 1/1981 | Miske et al. | 361/128 |
| 2,571,027 | 10/1951 | Garner | 361/57 X |
| 2,928,956 | 3/1960 | Jones | 361/57 |
| 3,387,216 | 6/1968 | Gagliardi et al. | 361/118 X |
| 3,518,492 | 6/1970 | Kresge et al. | 361/128 |
| 3,544,847 | 12/1970 | Sakshaug et al. | 361/130 X |
| 3,657,594 | 4/1972 | Latal | 361/128 X |
| 3,673,459 | 6/1972 | Carpenter | 361/128 X |
| 3,967,160 | 6/1976 | Kresge et al. | 361/130 X |
| 4,029,997 | 6/1977 | Wittel | 361/118 X |
| 4,072,998 | 2/1978 | Schei | 361/128 X |

FOREIGN PATENT DOCUMENTS

| 1242720 | 7/1963 | Fed. Rep. of Germany . |
| 2834072 | 2/1980 | Fed. Rep. of Germany . |
| 2834029 | 3/1980 | Fed. Rep. of Germany . |

OTHER PUBLICATIONS

P. Zehnel et al., "Protective Devices for High Transmitter Tubes if There are Internal Sparkovers", (Electrical Engineering), Feb. 7, '69, vol. 21, No. 3, pp. 54–58.

Primary Examiner—M. H. Paschall
Assistant Examiner—A. Jonathan Wysocki
Attorney, Agent, or Firm—Spencer & Frank

[57] ABSTRACT

A device for protecting a circuit against flashovers due to an overvoltage, which device includes first and second controllable arc discharge members connected in series with one another and in parallel with a current path of the circuit which is to be protected against flashover, and ignition control components connected for causing an arc discharge to be produced in the first member in response to the appearance of a current which exceed a selected value in the current path and for causing an arc discharge to be produced in the second member in response to the production of an arc discharge in the first member.

8 Claims, 2 Drawing Sheets

PROTECTION DEVICE AGAINST FLASHOVER IN A TRANSMITTER CIRCUIT

BACKGROUND OF THE INVENTION

This invention relates to a protection device against flashover in a circuit, in which a first discharge gap is connected in parallel with the circuit to be protected and is constructed to produce an arc when a voltage applied to the circuit exceeds a selected value.

Protection devices of this type are described in DE-OS No. 28 34 029 and DE-PS No. 28 33 992, in which the circuit of a radio transmitter to be protected, e.g. consisting of a switching and output stage tube and a free-running diode, is protected by a discharge gap, e.g. an ignitron, connected in parallel with the circuit. The discharge gap will be fired by an ignition circuit whenever an undesirable overvoltage occurs in the circuit to be protected.

If such a radio transmitter is designed, for example, as a pulse-duration modulated high power transmitter with an output power such as 600 kW, a d.c. voltage of about 30 kV is required at the circuit to be protected. A discharge gap connected in parallel with the circuit points across which the 30 kV voltage is present should possess higher electric strength in the non-conductive state so that no spurious ignition of the discharge gap occurs which causes an undesired disruption.

At present, ignitrons usable for such purposes can only withstand a maximum direct voltage of about 50 kV in the non-conductive state at an ambient temperature of 20° C. Owing to physical properties, this maximum direct voltage drops to about 35 kV at an ambient temperature of about 45° C. Since such ambient temperature will occur if, for example, the transmitter is operated in a tropical climate, a safety margin of about 5 kV with respect to the continuous operation voltage (30 kV) is insufficient.

Small transient overvoltages, which are unavoidable in transmitter operation, would cause disruption by so-called overhead ignition of the ignitron, i.e., an ignition occurring via the anode-cathode gap, thus bypassing the ignition electrode, or igniter.

To prevent such a problem, it would make sense to cool the ignition properly. But, particulary in tropical climates, this requires costly air conditioning. It would also be logical to connect at least two ignitrons in series and to ignite these by means of at least one common ignition circuit. It should be noted, however, that at least one of the ignitrons is set in the non-conductive state at a high voltage. The ignition circuit should therefore offer corresponding electric strength. But such an ignition circuit is not cost-effective.

SUMMARY OF THE INVENTION

It is a primary object of the invention, therefore, to provide economical and reliable protection against any disruptive overvoltage in a circuit to be protected.

The above and other objects are achieved, according to the invention, by a device for protecting an electrical circuit having a current path against a overvoltage that produces a current surge in the current path, the device comprising:

a first arc discharge member having means defining an arc current path and a control input and arranged to have a current arc produced along the arc current path of the first member when a voltage having at least a selected amplitude is present across that arc current path and a selected signal is present at the control input of the first member;

a second arc discharge member having means defining an arc current path and a control input and arranged to have a current arc produced along the arc current path of the second member when a voltage having at least a selected amplitude is present across that arc current path and a selected signal is present at the control input of the second member;

means connecting the first and second members together in a series arrangement and connecting the series arrangement in parallel with the current path of the electrical circuit;

first ignition circuit means for controlling only the first member and connected between the electrical circuit and the control input of the first member for applying the selected signal to the control input of the first member in response to the appearance of a current which exceeds a selected value in the current path of the electrical circuit; and second ignition circuit means for controlling the second member, the second ignition circuit means comprising: a source of electrical energy, a current limiter connected between the source and the control input of the second member for supplying current to the control input of the second member, and an arc discharge control means connected between the control input of the second member and the arc current path of the first member for causing the selected signal to be applied to the control input of the second member in response to the production of a current arc along the arc current path of the first member.

One advantage of the invention is that the protection device monitors itself, i.e., unintended ignition of one discharge gap automatically causes ignition of all the discharge gaps, so that, on the one hand, any possible overvoltage is prevented and, on the other hand, the original starting condition, which is needed for the ignition of the discharge gaps, is restored.

DESCRIPTION OF THE PREFERRED EMBODIMENTS

Figure 1:
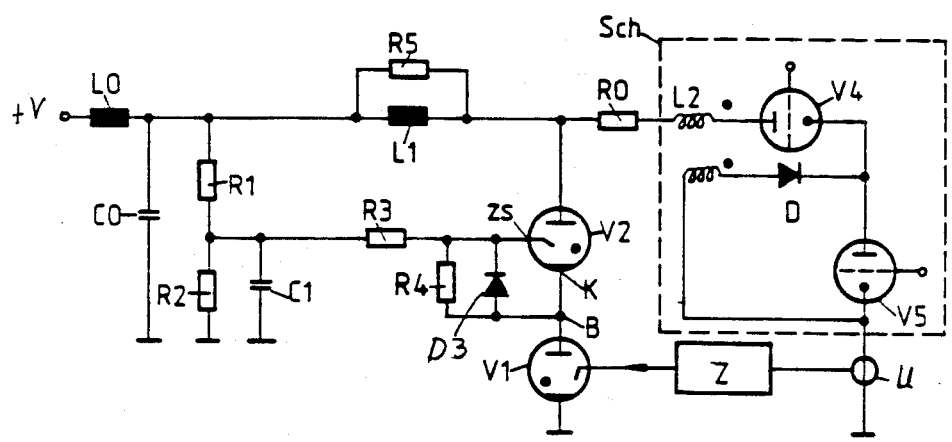
FIGS. 1, 2 and 3 are circuit drawings of three embodiments of the present invention.

FIG. 1 shows a direct voltage +V, e.g., 30 kV, smoothed by an inductor L0 and a capacitor C0, capacitor C0 being connected in parallel with the circuit Sch to be protected. Circuit Sch includes, in the case of a pulse-duration modulated transmitter, for example, an output stage tube V5, a switching tube V4, a diode D and a storage coil L2.

Components R0, R5 and L1, inserted between capacitor C0 and circuit Sch, have negligible impedance values, so that a voltage flashover in tubes V4 and V5 will cause a discharge process in capacitor C0. Capacitor C0 has a capacitance, for example, of 60 uF, so that the energy stored in it would cause destruction of circuit Sch.

To protect circuit Sch according to the invention, a series connection of two ignitable arc discharge devices V1 and V2, e.g., ignitrons, is connected in parallel with circuit Sch. In the event of a flashover in circuit Sch, devices V1 and V2 are turned on by means of a transformer U and a single ignition circuit Z, so that the charge stored in capacitor C0 is conducted via current limiter components R5, L1 and conductive arc discharge devices V1 and V2.

The charge stored in circuit Sch is simultaneously carried off via current limiter resistor R0.

A voltage divider composed of two resistors R1 and R2 having substantially identical resistances is connected across voltage +V so that when devices V1 and V2 are off, the voltage of the center tap of the voltage divider will be +V/2, or 15 kV, and this voltage is applied to igniter ZS and the cathode K of the additional discharge device V2 and to the anode of the first discharge device V1.

A capacitor C1, serving as an ignition energy source, is connected in parallel with resistor R2 and the voltage divider center tap, i.e. the point of connection between resistors R1 and R2, is connected to igniter ZS via a series resistor R3. A parallel arrangement of a further resistor R4 and a diode D3 is connected between igniter ZS and a point B which is connected to both cathode K of device V2 and the anode of device V1. Diode D3 is poled to prevent igniter ZS from going negative relative to cathode K.

In the event of a voltage flashover in circuit Sch, e.g., in tubes V4, V5, transformer U inserted between the cathode of tube V5 and ground activates ignition circuit Z, which turns on the first discharge device V1, whose cathode is also connected to ground. The ignited first discharge device V1 causes a connection of point B to ground. As a result, capacitor C1 discharges through resistors R3 and R4 and the first discharge device V1. This discharge process furnishes the ignition energy needed to turn on the additional discharge device V2. The ignition current is limited by resistor R3, which acts as an ignition current limiter.

In the process, diode D3 connected between igniter ZS and cathode K of the additional discharge device V2 prevents disruptive negative voltages at igniter ZS with respect to corresponding cathode K. The voltage drop across resistor R4 creates the ignition voltage between igniter ZS and corresponding cathode K needed to turn on the additional discharge device V2, and the additional discharge device V2 is therefore turned on as well. The ignition energy is limited by the capacitance of ignition energy accumulator C1. The direct voltage across capacitor C1 is limited by resistor R1 and R2 in parallel.

The turn-on of both devices V1 and V2 causes a short circuit for the voltage source supplying operating voltage V, for capacitor C0 and for circuit Sch, by means of which disruptive overvoltages are lowered. In the process, the parallel connection of resistor R5 and inductor L1 prevents a premature turn-off of ignited discharge devices V1 and V2. The operating characteristics of this process are described in greater detail in the above-cited DE-OS No. 28 34 029. Advantageously, only one ignition circuit Z is thus needed which is at a low potential and which generates the ignition required only for the first discharge device V1.

Figure 2:
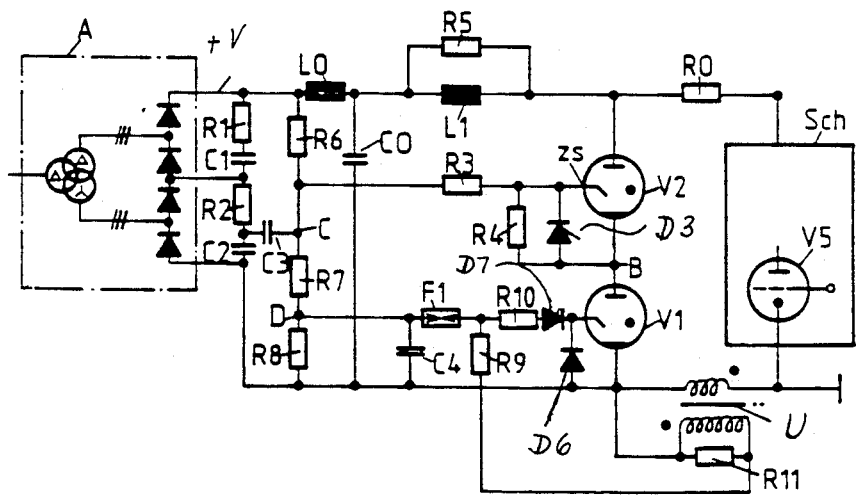

FIG. 2 shows a second practical embodiment in which a 12-pulse high voltage rectifier A generates an operating voltage +V, for example, of 30 kV that is smoothed by inductor L0 and capacitor C0 and is applied to circuit Sch. Circuit Sch corresponds to that of FIG. 1. In the 12-pulse high voltage rectifier A the secondary windings of the 3-phase line transformer and the rectifier diodes are connected in such a way that the resulting raw dc-voltage has a lowest ripple-frequency twelve times line frequency, e.g. 50 Hz. For this lowest ripple-frequency of e.g. 600 Hz comparativly small smoothing components can be used.

An RC chain R1, C1/R2, C2 at operating voltage +U serves to protect the rectifier diodes in high voltage rectifier A against disruptive transient overvoltages. Point B is set at half the operating voltage +U/2, as in the embodiment of FIG. 1, by voltage divider R6, R7, and R8.

Following is a more detailed description of transformer U and ignition circuit Z, which also applies to the embodiment shown in FIG. 1.

If the above-mentioned voltage flashover occurs in circuit Sch, e.g. in tube V5, a negative voltage is applied by transformer U, whose secondary is bridged by a resistor R11, and by a resistor R9, to a threshold switch F1, preferably a conventional spark gap, to which an initial positive voltage has been applied by a capacitor C4 connected across voltage divider resistor R8. Switch F1 then becomes conductive so that capacitor C4 discharges via threshold switch F1, current limiter resistor R10 and diode D7 to the igniter of the first discharge device V1, e.g., preferably an ignitron, which then turns on, i.e. arcs through. Diodes D6 and D7 assure that the igniter receives only a positive voltage with respect to the corresonding cathode of device V1.

Point B is then set essentially to ground potential since the voltage drop at the primary winding of transformer U is negligible. A capacitor C3, initially uncharged, is now charged intermittently via components R3, R4, V1 and C2. Capacitor C3 serves the additional discharge device V2, preferably also an ignitron, as an ignition energy accumulator whose charging current creates such a voltage drop across resistor R4 that the additional discharge device V2 will turn on. The same effect is achieved thereby as in the embodiment of FIG. 1.

FIG. 2 shows the advantageous self-monitoring feature mentioned above which applies in similar fashion to the embodiment of FIG. 1. If, in a not desired manner the first discharge device V1 should turn on overhead, i.e., via the anode-cathode gap, owing to a high anode-cathode voltage pulse, for instance, the ignition process described above will take place. If, on the other hand, it is the additional discharge device V2 that is turned on inadvertently, point B is raised to a potential of about 30 kV (operating voltage), and point C as well. This takes place via components D3, R4 and R3. Point D is raised to double its normal positive voltage via resistor R7, so that threshold switch F1 will become conductive. Capacitor C4 discharges and turns on the first discharge device V1, in the manner described above.

Figure 3:
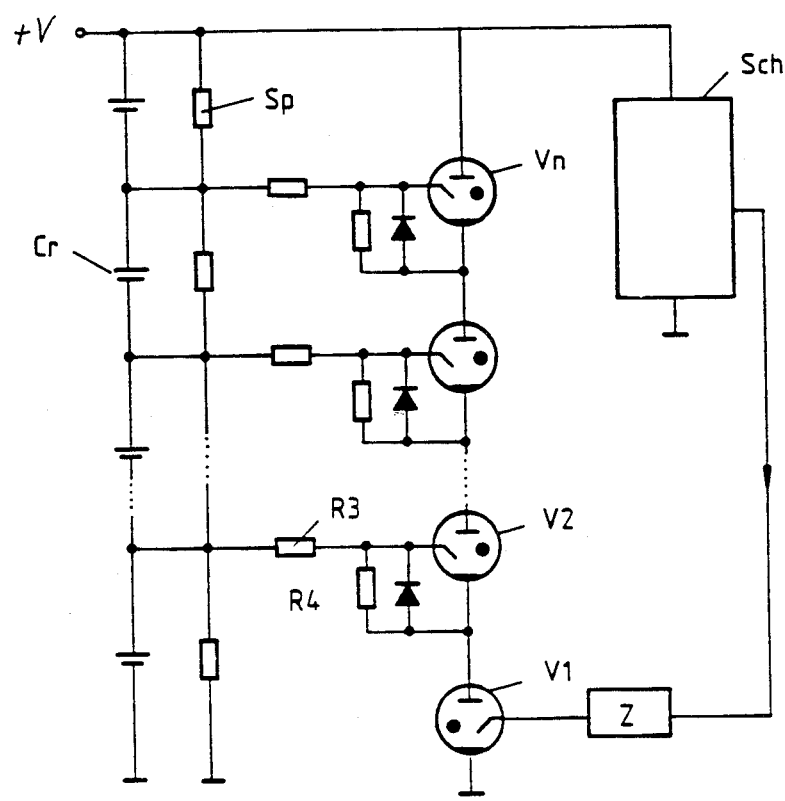

FIG. 3 is the circuit diagram of an embodiment having a series connection of more than two discharge devices, V1 to Vn, e.g. ignitrons, connected in parallel to the circuit Sch to be protected. The ignition process logically follows the same sequence as in the embodiments already described. Only the first discharge device V1 is turned on by ignition circuit Z. Resistive voltage divider Sp generates the required ignition voltages for the discharge device V2 to Vn, the series connection of capacitors Cr supplies the necesary ignition energy. FIG. 3 shows only those components which are necessary for the ignition process. The embodiment could be provided with further components similar to the elements U, C0, R5, L1 and R0 of FIG. 1, as well as the specific embodiment of ignition circuit Z, as shown in FIG. 2.

The invention is not restricted to the practical examples described above and can be applied in analogous manner to further embodiments. For example, it is possible to use as threshold switch F1 a thyristor with an appropriate control circuit.

This invention relates to subject matter disclosed in 1 FRG Application No. P 35 30 677.7 of Aug. 28, 1985, the disclosure of which is incorporated herein by reference.

It will be understood that the above description of the present invention is susceptible to various modifications, changes and adaptations, and the same are intended to be comprehended within the meaning and range of equivalents of the appended claims.

We claim:

1. An electric circuit protecting device a circuit current path against an overvoltage that produces a current surge in the circuit current path, said device comprising:
    a first arc discharge member having means defining an arc current path and a control input and arranged to have a current arc produced along said arc current path of said first member when a voltage having at least a selected amplitude is present across that arc current path and a selected signal is present at said control input of said first member;
    a second arc discharge member connected in a series arrangement with said first member and having means defining an arc current path and a control input and arranged to have a current arc produced along said arc current path of said second member when a voltage having at least a selected amplitude is present across that arc current path and a selected signal is present at said control input of said second member;
    means for connecting said series arrangement in parallel with the circuit current path of the electrical circuit;
    first ignition circuit means for controlling only said first member and for connecting the electrical circuit to said control input of said first member and for applying the selected signal to said control input of said first member in response to the appearance of a current which exceeds a selected value in the circuit current path of the electrical circuit; and
    second ignition circuit means for controlling said second member, said second ignition circuit means comprising: a source of electrical energy, current limiter means, connected between said source and said control input of said second member, for supplying current to said control input of said second member, and an arc discharge control means, connected between said control input of said second member and said arc current path of said first member, for causing the selected signal to be applied to said control input of said second member in response to the production of a current arc along said arc current path of said first member.

2. A device as defined in claim 1 wherein said means defining an arc current path of each of said first member and said second member comprise a cathode and an anode defining respective ends of the associated arc current path; the arc current paths of said first and second members are connected together in series; and each said ignition circuit means comprises respective rectifier means for preventing said control input of the associated member from having a negative potential relative to the associated cathode.

3. A device as defined in claim 2 wherein said first ignitron circuit means comprises: a second source of electrical energy at a potential sufficient to establish the selected signal; a series connection of a threshold switch having two ends and a current limiter connected between said second source and said control input of said first member so that one end of said switch is directed toward said second source; a transformer having a prixnary to be connected to the electrical circuit and a secondary; a resistor connected across said secondary; and means, including a second current limiter, for connecting said secondary between said arc current path of said first member and the other end of said threshold switch.

4. A device as defined in claim 3 wherein said threshold switch comprises a spark gap.

5. A device as defined in claim 3 further comprising impedance means connected between said control input of said second member and said one end of said threshold switch for supplying the selected signal to said control input of said second member in response to production of a current arc in said first member.

6. A device as defined in claim 1 wherein said first ignitron circuit means comprises: a second source of electrical energy at a potential sufficient to establish the selected signal; a series connection of a threshold switch having two ends and a current limiter connected between said second source and said control input of said first member so that one end of said switch is directed toward said second source; a transformer having a primary to be connected to the electrical circuit and a secondary; a resistor connected across said secondary; and means including, a second current limiter, for connecting said secondary between said arc current path of said first member and the other end of said threshold switch.

7. A device as defined in claim 6 wherein said threshold switch comprises a spark gap.

8. A device as defined in claim 6 further comprising impedance means connected between said control input of said second member and said one end of said threshold switch for supplying the selected signal to said control input of said second member in response to production of a current arc in said first member.

* * * * *